(12) United States Patent
Zhang

(10) Patent No.: US 10,368,444 B2
(45) Date of Patent: Jul. 30, 2019

(54) FINGERPRINT MODULE, METHOD FOR MANUFACTURING THE FINGERPRINT MODULE, AND MOBILE TERMINAL

(71) Applicant: Guangdong Oppo Mobile Telecommunications Corp., LTD., Dongguan (CN)

(72) Inventor: Wenzhen Zhang, Dongguan (CN)

(73) Assignee: Guangdong Oppo Mobile Telecommunications Corp., Ltd., Dongguan (CN)

( * ) Notice: Subject to any disclaimer, the term of this patent is extended or adjusted under 35 U.S.C. 154(b) by 0 days.

(21) Appl. No.: 15/677,415

(22) Filed: Aug. 15, 2017

(65) Prior Publication Data

US 2018/0054896 A1 Feb. 22, 2018

(30) Foreign Application Priority Data

Aug. 16, 2016 (CN) .......................... 2016 1 0675359
Aug. 16, 2016 (CN) ..................... 2016 2 0888908 U

(51) Int. Cl.
| | |
|---|---|
| *H05K 1/18* | (2006.01) |
| *H05K 1/11* | (2006.01) |
| *H05K 1/14* | (2006.01) |
| *H04M 1/02* | (2006.01) |
| *G06K 9/00* | (2006.01) |
| *H05K 1/02* | (2006.01) |
| *H05K 3/30* | (2006.01) |
| *H05K 3/36* | (2006.01) |

(Continued)

(52) U.S. Cl.
CPC ............ *H05K 1/189* (2013.01); *H04M 1/026* (2013.01); *H05K 1/0281* (2013.01); *H05K 1/111* (2013.01); *H05K 1/144* (2013.01); *H05K 3/301* (2013.01); *H05K 3/305* (2013.01); *H05K 3/363* (2013.01); *H05K 5/03* (2013.01); *G06F 1/1684* (2013.01);

(Continued)

(58) Field of Classification Search
CPC ............ G06K 9/0002; G06K 9/00053; G06K 9/00006; H05K 1/189; H05K 2201/04; H05K 2201/041; H05K 2201/042; H05K 2201/043; H05K 2201/044; H05K 2201/045; H05K 2201/046; H05K 2201/047; H05K 2201/048; H05K 2201/049; H05K 2201/10151; H05K 2201/10378; H04M 2250/12

See application file for complete search history.

(56) References Cited

U.S. PATENT DOCUMENTS

| | | | | |
|---|---|---|---|---|
| 5,933,712 A | * | 8/1999 | Bernhardt | ........... H01L 23/5387 257/E23.177 |
| 2003/0209362 A1 | * | 11/2003 | Kasuga | .............. G06K 19/0718 174/260 |

(Continued)

FOREIGN PATENT DOCUMENTS

| | | |
|---|---|---|
| CN | 103699881 A | 4/2014 |
| CN | 104407751 A | 3/2015 |

(Continued)

*Primary Examiner* — Roshn K Varghese
(74) *Attorney, Agent, or Firm* — Young Basile Hanlon & MacFarlane, P.C.

(57) ABSTRACT

A fingerprint module includes a cover plate, a fingerprint chip, an intermediate board, and a circuit board. An assembling region is disposed on the cover plate. The fingerprint chip is fixed in the assembling region. The intermediate board is bonded to one surface of the fingerprint chip opposite to the cover plate to press the fingerprint chip. The circuit board is electrically connected to the fingerprint chip via the intermediate board.

17 Claims, 15 Drawing Sheets

(51) Int. Cl.
  *H05K 5/03* (2006.01)
  *G06F 1/16* (2006.01)
(52) U.S. Cl.
  CPC .. *G06F 2203/0338* (2013.01); *G06K 9/00006* (2013.01); *H04M 2250/12* (2013.01); *H05K 2201/041* (2013.01); *H05K 2201/10151* (2013.01); *H05K 2201/10318* (2013.01); *H05K 2201/10325* (2013.01); *H05K 2201/10757* (2013.01)

(56) References Cited

U.S. PATENT DOCUMENTS

| | | | |
|---|---|---|---|
| 2006/0034499 A1* | 2/2006 | Shinoda | G06K 9/00013 382/124 |
| 2006/0083411 A1* | 4/2006 | Benkley, III | G06K 9/00053 382/124 |
| 2014/0285955 A1 | 9/2014 | Matsumoto | |
| 2015/0071510 A1 | 3/2015 | Kim et al. | |
| 2015/0245514 A1 | 8/2015 | Choung et al. | |
| 2016/0234949 A1 | 8/2016 | Seo et al. | |
| 2017/0004343 A1 | 1/2017 | Xie et al. | |
| 2017/0075483 A1 | 3/2017 | Ling et al. | |
| 2017/0285746 A1* | 10/2017 | Kim | G06F 3/016 |
| 2018/0054896 A1 | 2/2018 | Zhang | |

FOREIGN PATENT DOCUMENTS

| | | |
|---|---|---|
| CN | 105095861 A | 11/2015 |
| CN | 105528104 A | 4/2016 |
| CN | 205193832 U | 4/2016 |
| CN | 205302318 U | 6/2016 |
| CN | 106096596 A | 11/2016 |
| CN | 206178865 U | 5/2017 |
| EP | 3054657 A1 | 8/2016 |

* cited by examiner

FINGERPRINT MODULE, METHOD FOR MANUFACTURING THE FINGERPRINT MODULE, AND MOBILE TERMINAL

CROSS REFERENCE TO RELATED APPLICATIONS

This application claims the priorities of Chinese Application No. 201610675359.8 filed Aug. 16, 2016 and Chinese Application No. 201620888908.5 filed Aug. 16, 2016. The entire disclosures of the above applications are incorporated herein by reference.

BACKGROUND

Field

The present disclosure relates to electronic devices, and more particularly to a fingerprint module, a method for manufacturing the fingerprint module, and a mobile terminal.

Background

When fingerprint identifications are more and more widely used in mobile phones, fingerprint module quality requirements also increase. A fingerprint module usually includes a fingerprint chip fixed on a cover plate. However, weight of the fingerprint chip is light. During assembly of the fingerprint chip to the cover plate, the fingerprint chip is easily separated from the cover plate due to influence by other parts. Accordingly, the quality of the fingerprint chip decreases, which leads to poor production quality of the fingerprint chip.

BRIEF DESCRIPTION OF THE DRAWINGS

To describe the technical solutions of the embodiments of the present disclosure more clearly, the following briefly introduces the accompanying drawings required for describing the embodiments. Apparently, the accompanying drawings in the following description show only some embodiments of the present disclosure, and those skilled in the art may still derive other drawings from these accompanying drawings without creative efforts.

DETAILED DESCRIPTION OF THE PREFERRED EMBODIMENTS

A clear and complete description of technical solutions provided in the embodiments of the present disclosure will be given below, in conjunction with the accompanying drawings in the embodiments of the present disclosure. Apparently, the embodiments described below are merely a part, but not all, of the embodiments of the present disclosure. All of other embodiments, obtained by those skilled in the art based on the embodiments of the present disclosure without any inventive efforts, fall into the protection scope of the present disclosure.

Figure 1:
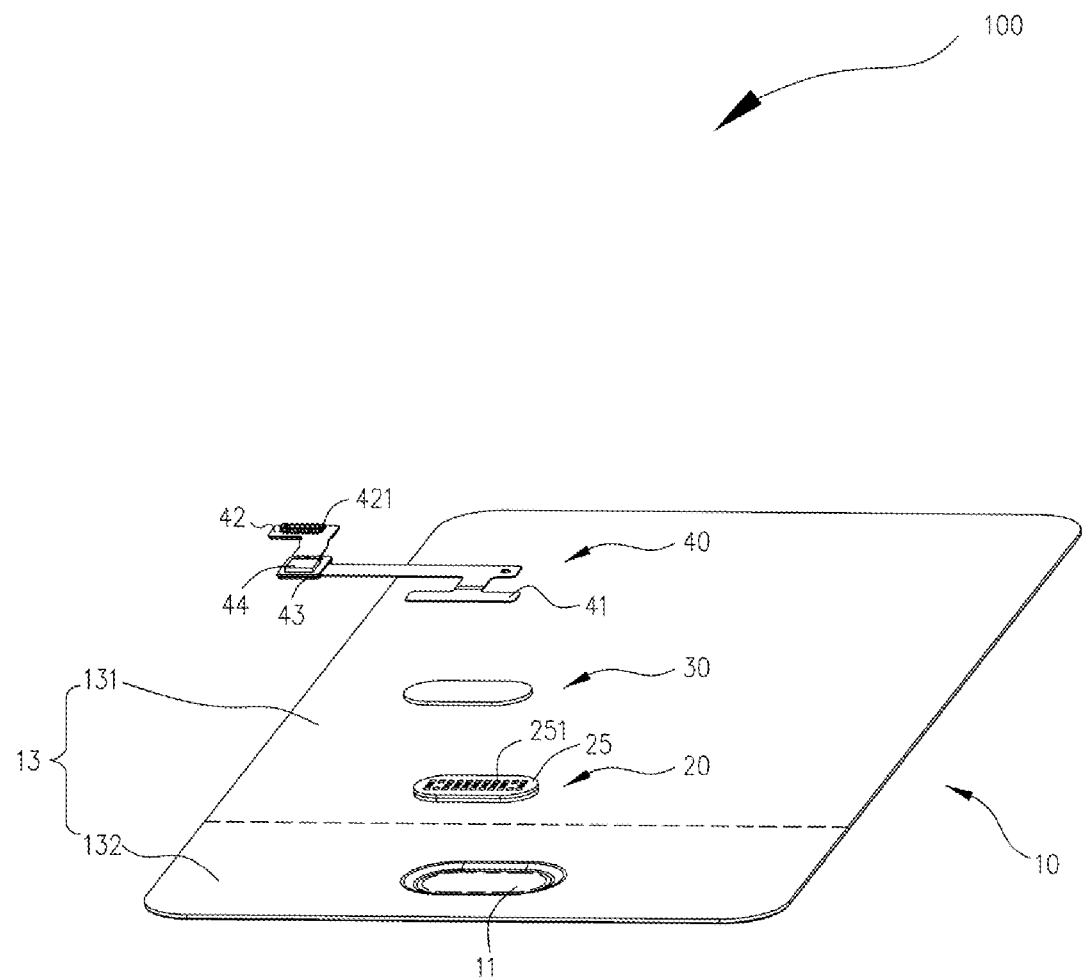
FIG. 1 illustrates an exploded view of a fingerprint module in accordance with a first embodiment of the present disclosure.
Figure 2:
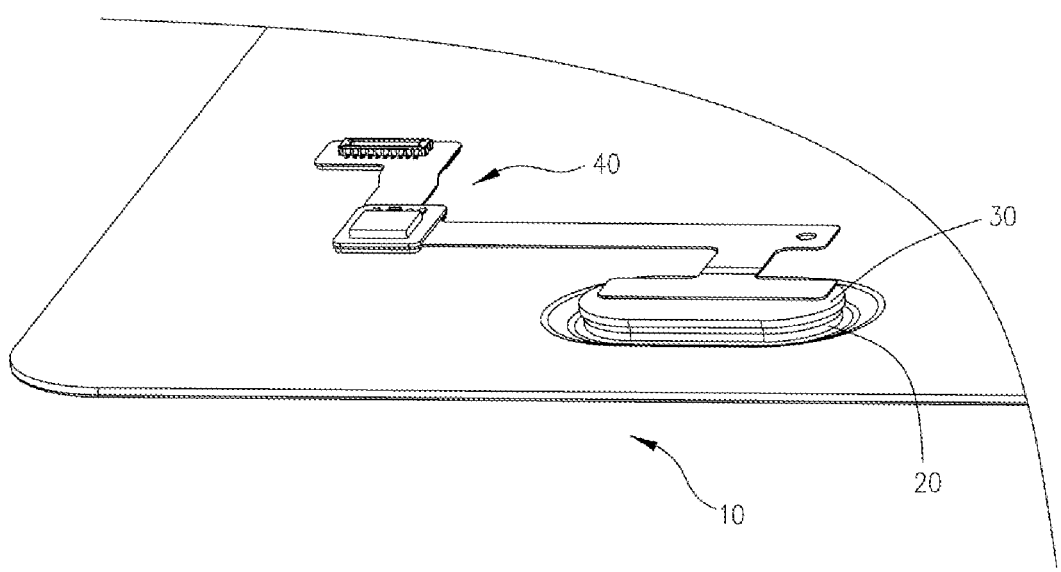
FIG. 2 illustrates an assembly drawing of the fingerprint module in FIG. 1.
Figure 3:
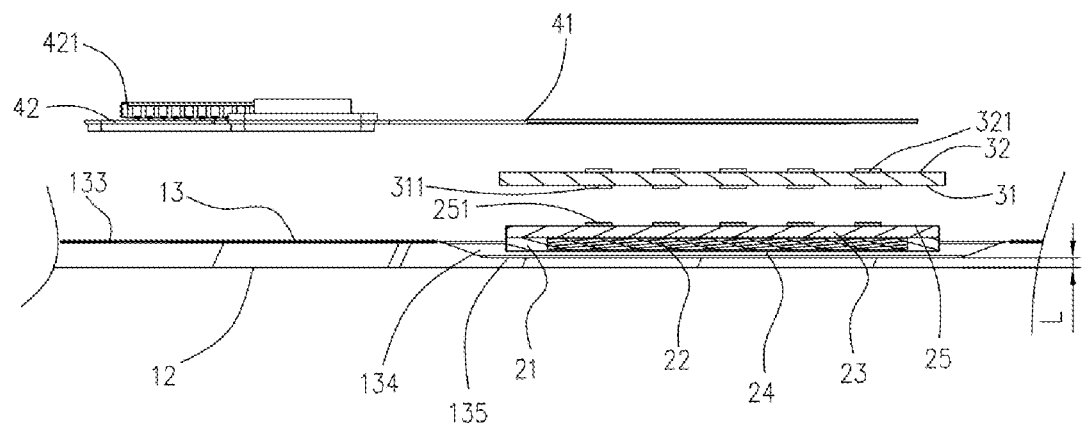
FIG. 3 illustrates a cross-sectional view of the fingerprint module in FIG. 1.
Figure 14:
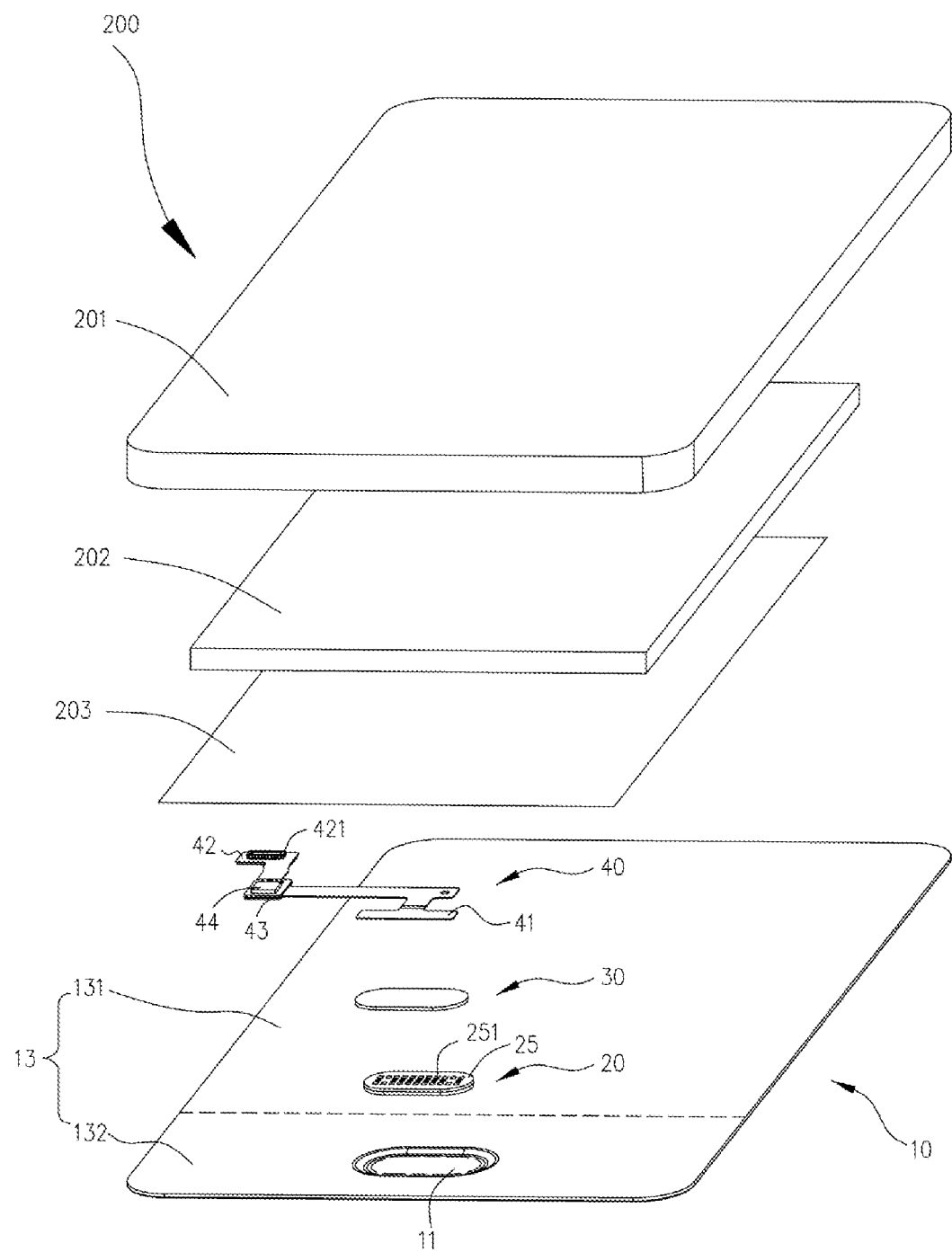
FIG. 14 illustrates a mobile terminal in accordance with the present disclosure.

Please refer to FIG. 1 to FIG. 3. An embodiment of the present disclosure provides a mobile terminal 200 (see FIG. 14). The mobile terminal 200 includes a terminal body 201 (see FIG. 14), a main board 202 (see FIG. 14), and a fingerprint module 100 which is fixed on the terminal body 201 and electrically connected to the main board 202. The fingerprint module 100 is configured to receive fingerprint information of a user and transmit the fingerprint information of the user to the main board 202. The main board 202 is configured to control the operation of the mobile terminal 200 based on the fingerprint information of the user.

The mobile terminal 200 may be a smart mobile terminal, such as a mobile phone, a computer, a tablet, a handheld game player, or a media player. In the present embodiment, the mobile terminal 200 is a mobile phone in the following description.

As illustrated in FIG. 1 to FIG. 3, the fingerprint module 100 includes a cover plate 10, a fingerprint chip 20, an intermediate board 30, and a circuit board 40. An assembling region 11 is disposed on the cover plate 10. The fingerprint chip 20 is fixed on the cover plate 10. In detail, the fingerprint chip 20 is fixed in the assembling region 11. The intermediate board 30 is bonded to one surface of the fingerprint chip 20 opposite to the cover plate 10 to press the fingerprint chip 20. The circuit board 40 is electrically connected to the fingerprint chip 20 via the intermediate board 30.

The intermediate board 30 is bonded to the fingerprint chip 20, so that a pressing force from weight of the intermediate board 30 is applied to the fingerprint chip 20, and a bonding force between the fingerprint chip 20 and the cover plate 10 is increased. As such, there is a firm bonding between the fingerprint chip 20 and the cover plate 10. The fingerprint chip 20 is not easily separated from the cover plate 10 due to influence of the circuit board 40, thereby improving the quality of the fingerprint module 100.

The cover plate 10 may be a front cover of the mobile phone or a rear cover of the mobile phone. In a first embodiment provided by the following description, the cover plate 10 is a front cover of the mobile phone. In detail, the cover plate 10 is used to cover a display screen 203 of the mobile terminal 200. The cover plate 10 includes an outer surface 12 and an inner surface 13 disposed opposite to the outer surface 12. The outer surface 12 faces the user, and the inner surface 13 is bonded to the main board 202. The inner surface 12 includes a light transmitting region 131 and a light shielding region 132 adjacent to a lower end of the light transmitting region 131. Light from the display screen 203 can pass through the light transmitting region 131 (see FIG. 14). An ink layer 133 is coated on the light shielding region 132. The ink layer 133 shields light from a non-display region of the display screen 203, thereby preventing light leakage of the display screen 203. The assembling region 11 is situated in the shielding region 132, so that the user can touch the fingerprint chip 20 in the assembling region 11 conveniently. In detail, a groove 134 is disposed in the shielding region 132 of the inner surface 13. The groove 134 includes a bottom surface 135 near the outer surface 12. The assembling region 11 and the bottom surface 135 overlap with each other. That is, the fingerprint chip 20 is bonded to the bottom surface 135, so that a distance between the fingerprint chip 20 and the bottom surface 135 is decreased. When the user touches a position of the outer surface 12 corresponding to the groove 134, the fingerprint chip 20 can receive the fingerprint information of the user. A distance L from the bottom surface 135 to the outer surface 12 is less than or equal to 0.3 millimeters (mm). By hiding the fingerprint chip 20 inside the cover plate 10, the fingerprint module 100 can be waterproofed, and appearance of the mobile terminal 200 can be improved. Moreover, thickness of the mobile terminal 200 can be effectively decreased. Certainly, in other embodiments, by enhancing signal receiving performance, the fingerprint chip 20 may be directly bonded to the inner surface 13, and thus manufacturing cost of the cover plate 10 may be reduced.

In the present embodiment, the fingerprint chip 20 is an elliptical-shaped plate. Shape of the fingerprint chip 20 is constituted by two semicircles and a rectangle. The fingerprint chip 20 includes a packaging layer 21, a chip 22, and a substrate 23. The chip 22 is fixed on the substrate 23. The packaging layer 21 is stacked on the substrate and covers the chip 22. In detail, the fingerprint chip 20 includes an identification surface 24, which is disposed on the packaging layer 21, and a connecting surface 25, which is disposed on the substrate 23. It can be appreciated that the identification surface 24 faces the user, and the identification surface 24 is adhered to the bottom surface 135. The identification surface 24 receives the fingerprint information of the user via the cover plate 10. The connecting surface 25 is back to the user. Pads 251 are disposed on the connecting surface 25, so that the fingerprint chip 20 may be electrically connected to the intermediate board 30 via the pads 251. In other embodiments, the fingerprint chip 20 may have a circular-shaped plate.

The intermediate board 30 may be a hard plate or a plate that can provide weight-pressing effect. When the intermediate board 30 is bonded to the fingerprint chip 20, the fingerprint chip 20 can be pressed by the intermediate board 30, so that a resistance force of the fingerprint chip 20 to the cover plate 10 is increased. As such, the fingerprint chip 20 and the cover plate 10 can be closely bonded with each other. After the fingerprint chip 20 and the cover plate 10 are closely bonded with each other, the circuit board 40 is electrically connected to the intermediate board 30. A traction force of the circuit board 40 to the fingerprint chip 20 is less than a bonding force between the fingerprint chip 20 and the cover plate 10. Accordingly, the fingerprint chip 20 is not easily separated from the cover plate 10, thereby ensuring the quality of the fingerprint module 100. By the balanced pressing of the intermediate board 30 to the fingerprint chip 20, the fingerprint chip 20 is closely bonded to the cover plate 10. As such, bubbling does not occur easily, the fingerprint chip 20 is smoothly bonded to the cover plate 10, and the quality of the fingerprint chip 20 is improved. The intermediate board 30 provides not only the pressing force for the fingerprint chip 20, but also provides an electrical conductivity function for the fingerprint chip 20 to transmit pulses of fingerprint signals. The intermediate board 30 is electrically connected to the fingerprint chip 20 and the circuit board 40 to transmit electrical signals of the fingerprint chip 20 to the circuit board 40. The circuit board 40 transmits the electrical signals to the main board 202 of the mobile terminal 200.

Please refer to FIG. 1 to FIG. 3. In the first embodiment, the intermediate board 30 is a printed circuit board. Circuits which are electrically conductive may be disposed at two surfaces of the intermediate board 30, so that the fingerprint chip 20 and the circuit board 40 are electrically connected with each other using the circuits at the two surfaces which are correspondingly and electrically connected to the fingerprint chip 20 and the circuit board 40. Moreover, the pads 251 of the fingerprint chip 20 may be connected to the circuit board 40 via different wires to ensure effective transmission of the electrical signals of the fingerprint chip 20. In detail, the intermediate board 30 includes a first contact surface 31 bonded to the fingerprint chip 20 and a second contact surface 32 opposite to the first contact surface 31. The circuit board 40 is bonded to the second contact surface 32. A plurality of first pins 311 electrically connected to the fingerprint chip 20 is disposed on the first contact surface 31. A plurality of second pins 321 which correspondingly and electrically connected to the first pins 311 is disposed on the second contact surface 32. The circuit board 40 is bonded to the second contact surface 32 and electrically connected to the second pins 321. The first pins 311 may be soldered to the pads 251 of the connecting surface 25 by solder. The second pins 321 may be soldered to the circuit board 40. As such, structural stability of the fingerprint module 100 can be ensured, and electrical performance of the fingerprint chip 20 and the circuit board 40 can be ensured as well.

Circuits electrically connected to the intermediate board 30 are disposed on the circuit board 40. One terminal of the circuit board 40 is electrically connected to the intermediate board 30, and the other one terminal is electrically connected to the main board 202 of the mobile terminal 200. The fingerprint chip 20 is situated in a lower end of the mobile terminal 200, and the main board 202 is usually positioned in a middle position of the mobile terminal 200. Accordingly, one terminal of the main board 202 connected to the circuit board 40 is shifted with respect to the fingerprint chip 20, and weight of the circuit board 40 is usually shifted with respect to the fingerprint chip 20. Length of the circuit board 40 is generally longer, and the weight of the circuit board 40 is heavier than that of the fingerprint chip 20. The circuit board 40 has the traction force applied to the fingerprint chip 20 due to the weight of the circuit board 40. However, the fingerprint chip 20 is pressed by the intermediate board 30, and the bonding force exists between the fingerprint chip 20 and the cover plate 10, so that the circuit board 40 influences the fingerprint chip 20 less. Accordingly, the length of the circuit board 40 may be increased. Other electronic components may be disposed in the circuit board 40, thereby increasing use efficiency of the circuit board 40 and improving adaptive performance of the fingerprint module 100. One end of the circuit board 40 far away from the fingerprint chip 20 may be connected to any position of the main board 202. The circuit board 40 may have any structure in the mobile terminal 200.

In the first embodiment, the circuit board 40 is a flexible circuit board. The circuit board 40 may be bent according to requirements. Specifically, the circuit board 40 includes a first terminal 41 and a second terminal 42 disposed corresponding to the first terminal 41. The first terminal 41 is soldered to the second pins 321 of the intermediate board 30. A connector 421 is disposed at the second terminal 42. The connector 421 may be pluggable into the main board 202, so that it is convenient for the fingerprint module 100 to be detachably connected to the main board 202. As such, the fingerprint module 100 may be maintained conveniently, and the adaptive performance may be improved. A strengthening layer 43 and an electronic element 44 stacked on the strengthening layer 43 may be disposed between the first terminal 41 and the second terminal 42. The strengthening layer 43 may be a steel strengthening structure. The electronic element 44 may be a capacitor, a resistor, or a diode. Speed of the electrical signals may be improved by disposing the strengthening layer 43 and the electronic element 44 between the first terminal 41 and the second terminal 42, and the electrical signals of the fingerprint chip 20 can be transmitted effectively. As such, although the weight of the circuit board 40 is increased, the fingerprint chip 20 is not affected, thereby ensuring that the fingerprint chip 20 and the cover plate 10 are bonded firmly to improve the quality of the fingerprint module 100. In other embodiments, the circuit board 40 may be stacked on the intermediate board 30 after being bent.

Figure 4:
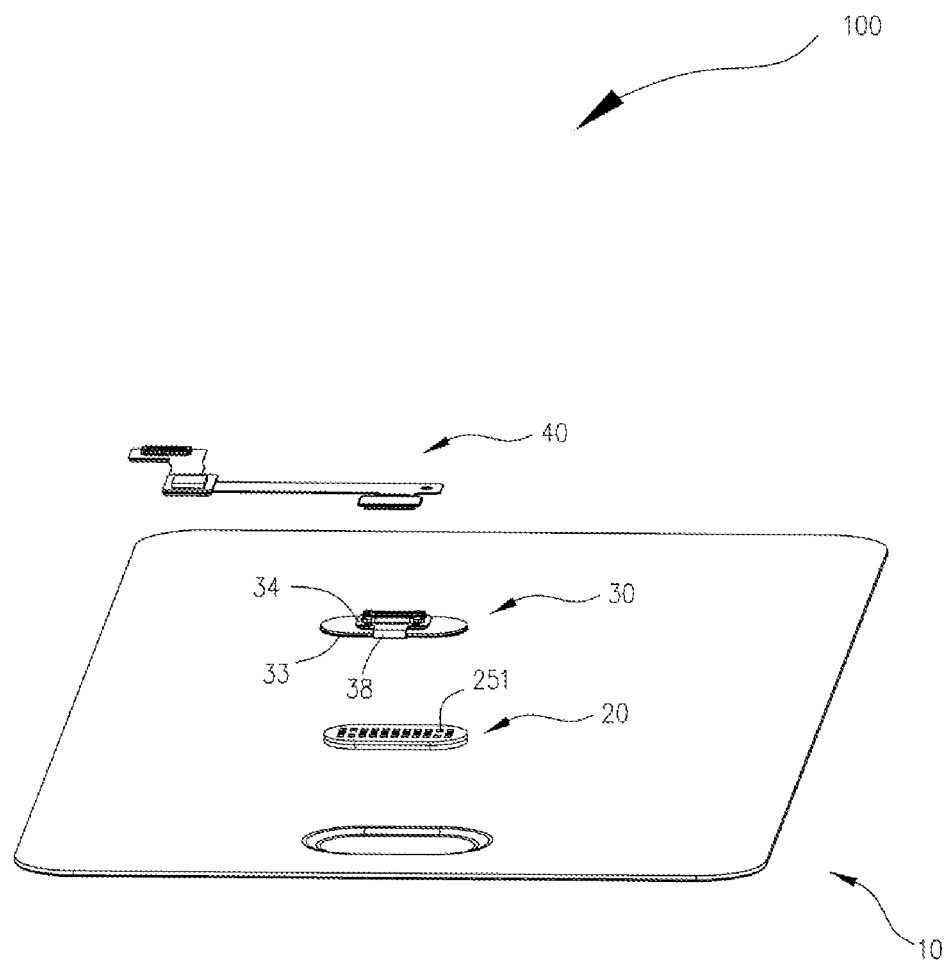
FIG. 4 illustrates an exploded view of a fingerprint module in accordance with a second embodiment of the present disclosure.
Figure 5:
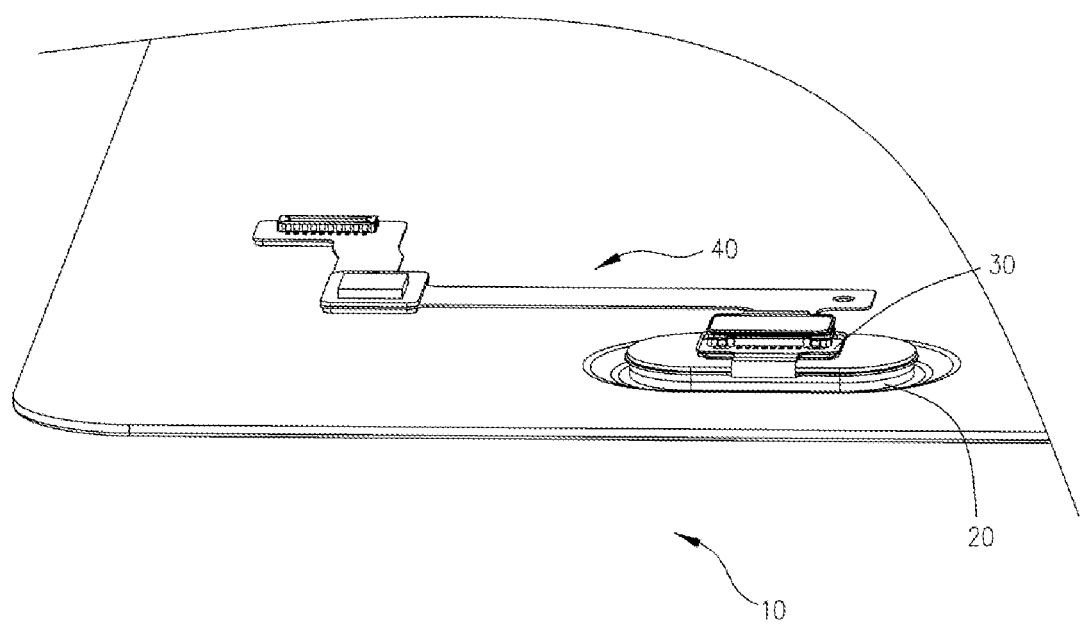
FIG. 5 illustrates an assembly drawing of the fingerprint module in FIG. 4.
Figure 6:
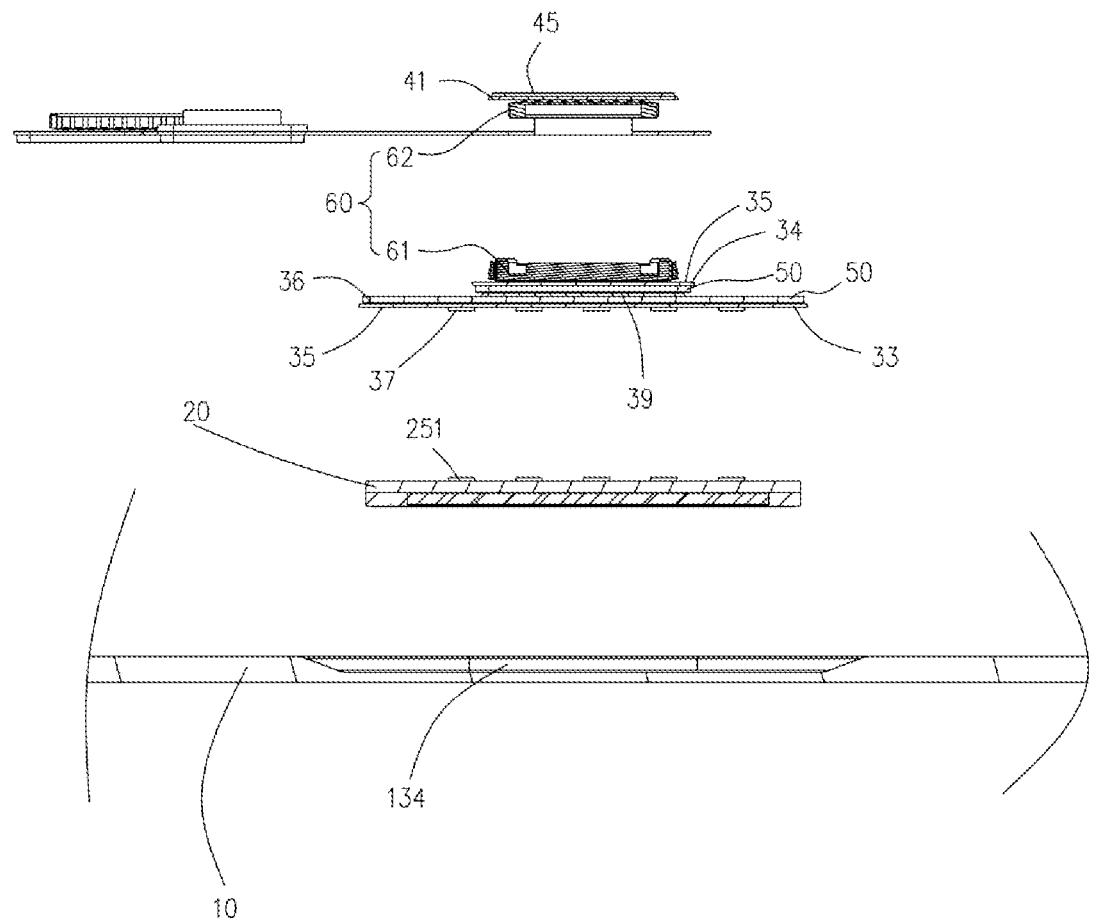
FIG. 6 illustrates a cross-sectional view of the fingerprint module in FIG. 4.

Please refer to FIG. 4 to FIG. 6. The present disclosure further provides a second embodiment approximately the same as the first embodiment. A difference is that the intermediate board 30 is a flexible circuit board. The intermediate board 30 may be bent arbitrarily, so that it is convenient to dispose copper foil wires for electrically connecting the fingerprint chip 20 to the circuit board 40, manufacturing cost of the intermediate board 30 is decreased effectively, and adaptation of the intermediate board 30 is increased. In detail, the intermediate board 30 includes a first connecting terminal 33 and a second connecting terminal 34 corresponding to the first connecting terminal 33. The second connecting terminal 34 is bent with respect to the first connecting terminal 33 and stacked on the first connecting terminal 33 via an adhesive. The first connecting terminal 33 is electrically connected to the fingerprint chip 20. The second connecting terminal 34 is electrically connected to the circuit board 40. In detail, the intermediate board 30 includes a first surface 35 and a second surface 36 opposite to the first surface 35. A plurality of copper foil wires 37 is disposed on the first surface 35 and extends from the first connecting terminal 33 to the second connecting terminal 34. Each of the copper foil wires 37 on the first connecting terminal 33 is connected to a corresponding one of the pads 251 of the fingerprint chip 20. Each of the copper foil wires 37 on the second connecting terminal 34 is connected to the circuit board 40. The copper foil wires 37 on the first connecting terminal 33 are soldered to the pads 251 by solder, so that the first connecting terminal 33 can be bonded to the fingerprint chip 20 firmly. Shape of the first connecting terminal 33 is matched with shape of the fingerprint chip 20. A geometric center of the first connecting terminal 33 overlaps with a geometric center of the fingerprint chip 20. Accordingly, the first connecting terminal 33 can press the fingerprint chip 20 effectively. The second connecting terminal 34 is stacked on the first connecting terminal 33 after being bent with respect to the first connecting terminal 33. The second connecting terminal 34 is connected to the circuit board 40, so that the intermediate board 30 can be bonded to the circuit board 40 firmly. The second connecting terminal 34 overlaps with the first connecting terminal 33, so that a center of gravity of the intermediate board 30 corresponds to a center of gravity of the fingerprint chip 20. Accordingly, the entire intermediate board 30 can press the fingerprint chip 20 effectively, and the fingerprint chip 20 can be bonded to the cover plate 10 firmly. The first connecting terminal 33 is connected to the second connecting terminal 34 via a connecting bar 38. The first connecting terminal 33 and the second connecting terminal 34 overlap with each other and are adhered together via a double-sided tape 39, so that entire structure of the intermediate board 30 is stable, and the center of gravity of the intermediate board 30 can correspond to a geometric center of the fingerprint chip 20. The copper foil wires 37 on the first connecting terminal 33 extent to the second connecting terminal 34 via the connecting bar 38, thereby ensuring that the intermediate board 30 is electrically connected to the fingerprint chip 20 and the circuit board 40.

In the second embodiment, the fingerprint module 100 further includes at least one strengthening plate 50 to ensure structural strength of the intermediate board 30 and increase the weight of the intermediate board 30 to raise force of the intermediate board 30 applied to the fingerprint chip 20. In the present embodiment, the fingerprint module 100 includes two strengthening plates 50. One of the two strengthening plates 50 is adhered to the first connecting terminal 33, and the other one of the two strengthening plates 50 is adhered to the second connecting terminal 34. The strengthening plates 50 are positioned on the second surface 36. Centers of gravity of the strengthening plates 50 correspond to the center of gravity of the fingerprint chip 20. The strengthening plates 50 may be strengthened by steel or resin. The two strengthening plates 50 are adhered together by the double-sided tape 39, thereby preventing the centers of gravity of the strengthening plates 50 from being shifted.

In the second embodiment, the intermediate board 30 and the circuit board 40 are electrically connected via a board-to-board connector 60. In detail, the board-to-board connector 60 includes a socket 61 and a plug 62. The socket 61 is soldered to the first surface 35 of the intermediate board 30 and positioned on the second connecting terminal 34. The socket 61 is electrically connected to the copper foil wires 37. The plug 62 is soldered to the circuit board 40 and positioned on the first terminal 41. In the circuit board 40, a strengthening layer 45 is disposed on one surface of the first terminal 41 opposite to the plug 62 to enhance bonding strength of the plug 62 and the socket 61. By disposing the board-to-board connector 60 between the intermediate board 30 and the circuit board 40, the weight of the intermediate board 30 is increased to enhance stability of the fingerprint chip 20. Moreover, it is convenient for the circuit board 40 to be connected to the intermediate board 30, and it is convenient for the circuit board 40 and the intermediate board 30 to be maintained detachably.

Figure 7:
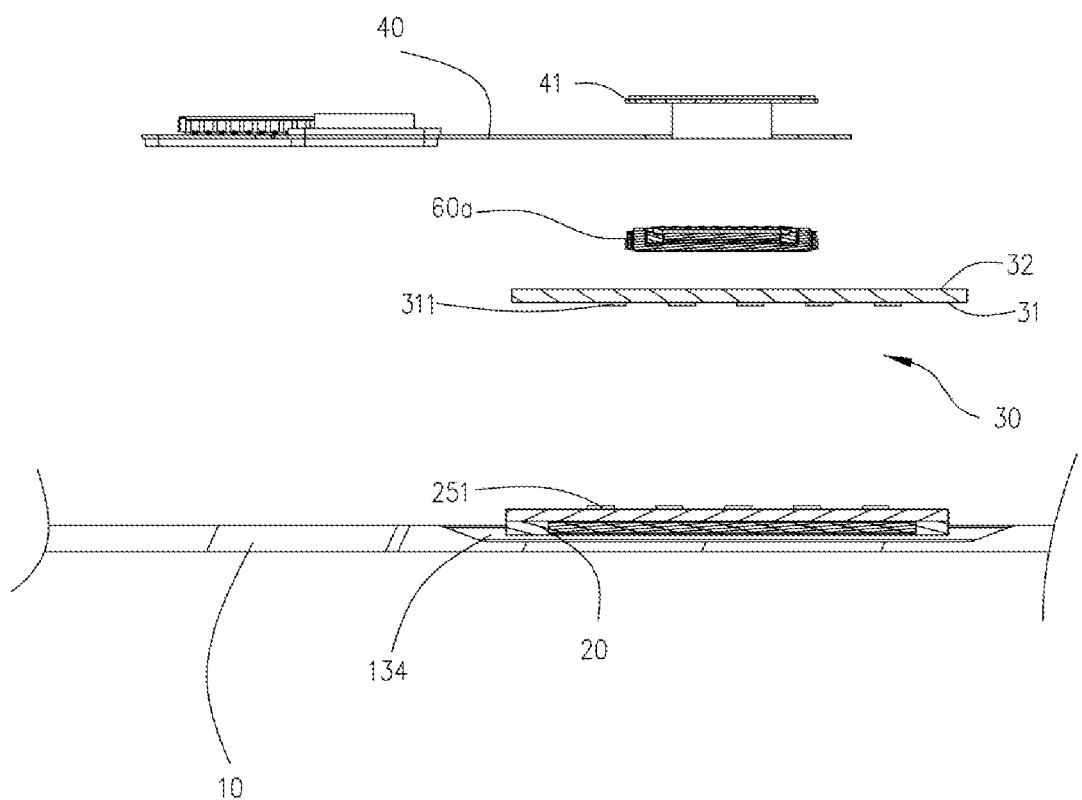
FIG. 7 illustrates a cross-sectional view of a fingerprint module in accordance with a third embodiment of the present disclosure.

Please refer to FIG. 7. The present disclosure further provides a third embodiment approximately the same as the first embodiment. A difference is that the intermediate board 30 and the circuit board 40 are electrically connected via a board-to-board connector 60a. A structure of the board-to-board connector 60a is the same as a structure of the board-to-board connector 60 and not repeated herein. In detail, after the intermediate board 30 is bonded to the fingerprint chip 20, the intermediate board 30 and the circuit board 40 are electrically connected using the board-to-board connector 60a. The board-to-board connector 60a is connected between the intermediate board 30 and the circuit board 40. Accordingly, the weight of the intermediate board 30 is increased, and a pressing force which is applied to the fingerprint chip 20 by the intermediate board 30 is raised, so that the fingerprint chip 20 and the cover plate 10 are bonded firmly.

Figure 8:
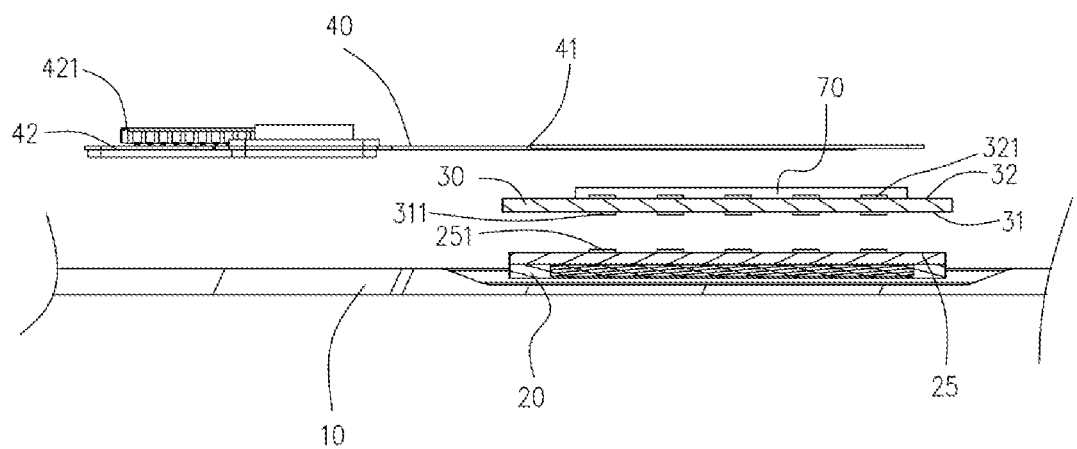
FIG. 8 illustrates a cross-sectional view of a fingerprint module in accordance with a fourth embodiment of the present disclosure.

Please refer to FIG. 8. The present disclosure further provides a fourth embodiment approximately the same as the first embodiment. A difference is that the intermediate board 30 and the circuit board 40 are electrically connected via an electrically conductive adhesive 70. In detail, after the intermediate board 30 is bonded to the fingerprint chip 20, the electrically conductive adhesive 70 is coated on the second contact surface 32 of the intermediate board 30. The first terminal 41 of the circuit board 40 is adhered to the second contact surface 32 via the electrically conductive adhesive 70. By heating and pressurizing the electrically conductive adhesive 70, metal particles inside the electrically conductive adhesive 70 are compressed to implement electrical conduction of the second pins 321 and the circuit board 40 in a direction perpendicular to the second contact surface 32. As such, the circuit board 40 is electrically connected to the intermediate board 30, and the circuit board 40 and the intermediate board 30 are bonded firmly.

Figure 9:
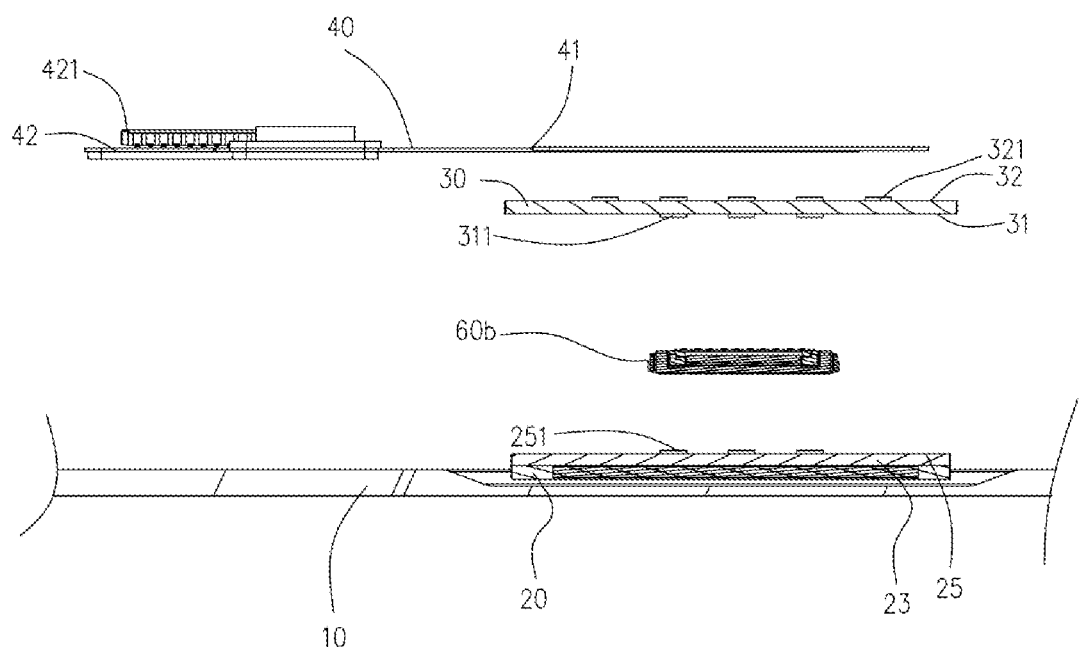
FIG. 9 illustrates a cross-sectional view of a fingerprint module in accordance with a fifth embodiment of the present disclosure.

Please refer to FIG. 9. The present disclosure further provides a fifth embodiment approximately the same as the first embodiment. A difference is that the fingerprint chip 20 and the intermediate board 30 are electrically connected via a board-to-board connector 60b. A structure of the board-to-board connector 60b is the same as a structure of the board-to-board connector 60a and not repeated herein. One side of the board-to-board connector 60b near the fingerprint chip 20 is soldered to the substrate 23 of the fingerprint chip 20 and electrically connected to the pads 251 of the connecting surface 25. The other side of the board-to-board connector 60b is soldered to the first contact surface 31 of the intermediate board 30 and electrically connected to the first pins 311 of the first contact surface 31.

Figure 10:
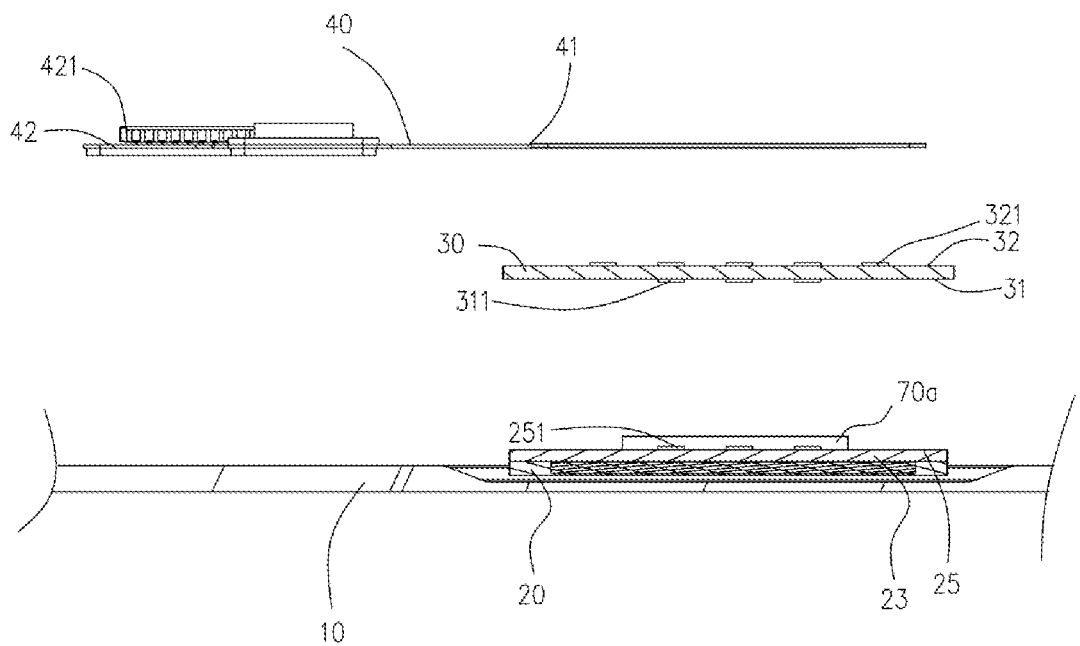
FIG. 10 illustrates a cross-sectional view of a fingerprint module in accordance with a sixth embodiment of the present disclosure.

Please refer to FIG. 10. The present disclosure further provides a sixth embodiment approximately the same as the first embodiment. A difference is that the fingerprint chip 20 and the intermediate board 30 are electrically connected via an electrically conductive adhesive 70a. In detail, the electrically conductive adhesive 70a is coated on the connecting surface 25 of the fingerprint chip 20. The intermediate board 30 is adhered to the connecting surface 25 via the electrically conductive adhesive 70a. The first pins 311 on the first contact surface 31 are electrically connected to the pads 251 of the connecting surface 25 via the electrically conductive adhesive 70a.

Certainly, the protection scope of the fingerprint module provided by the present disclosure may be simple substitutions or combinations of the above-mentioned embodiments to constitute new embodiments.

Figure 11:
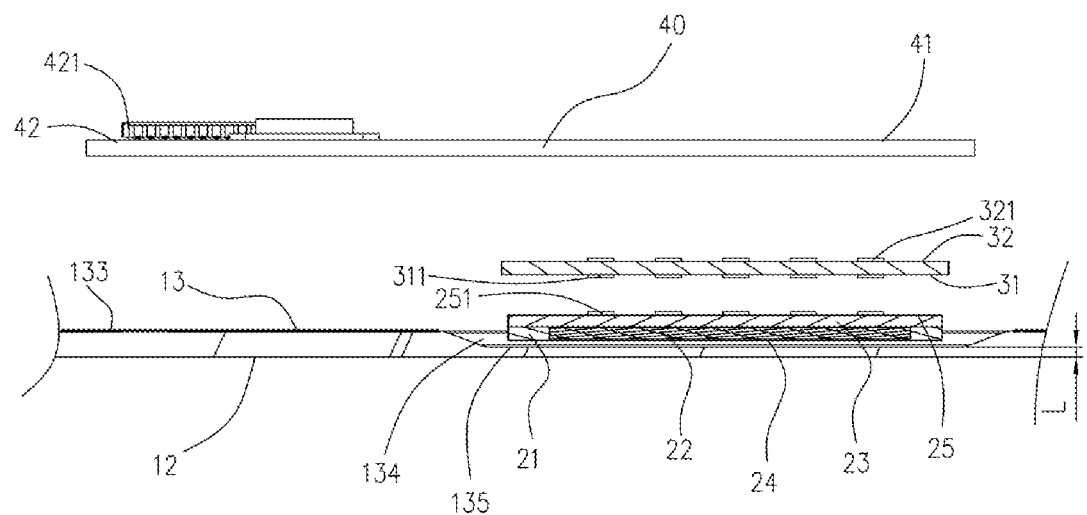
FIG. 11 illustrates a cross-sectional view of a fingerprint module in accordance with a seventh embodiment of the present disclosure.

Please refer to FIG. 11. The present disclosure further provides a seventh embodiment approximately the same as the first embodiment. A difference is that the circuit board 40 is a printed circuit board. The circuit board 40 may be the main board 202 of the mobile terminal 200 or a main board independent of the mobile terminal 200. That is, one side of the circuit board 40 is soldered to the main board 202 of the mobile terminal 200, and the other side of the circuit board 40 is soldered to the intermediate board 30. Since rigid strength of the circuit board 40 is increased, the circuit board 40 can support the fingerprint chip 20 firmly, thereby improving the quality of the fingerprint module 100. Certainly, in the second embodiment, the circuit board 40 may be substituted by a printed circuit board.

Figure 12:
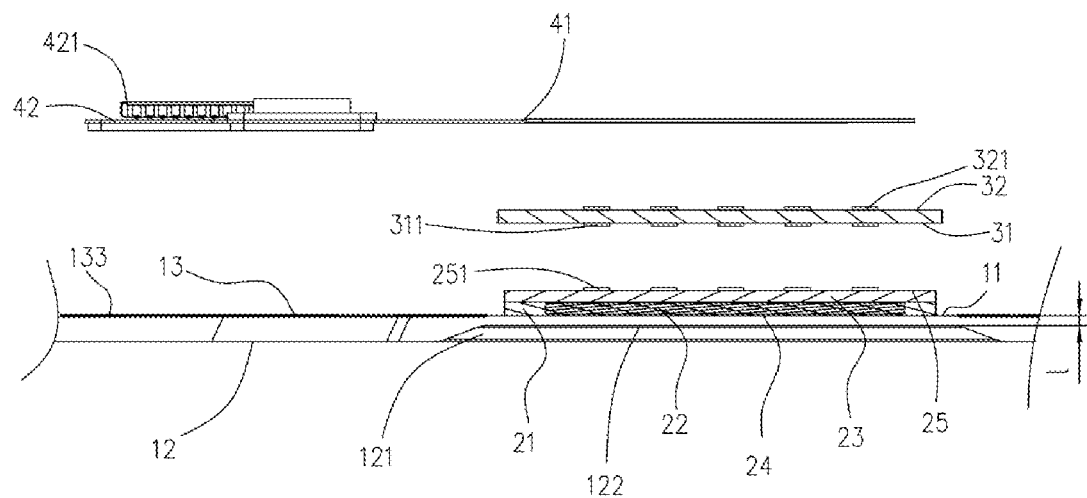
FIG. 12 illustrates a cross-sectional view of a fingerprint module in accordance with an eighth embodiment of the present disclosure.

Please refer to FIG. 12. The present disclosure further provides an eighth embodiment approximately the same as the first embodiment. A difference is that a groove 121 is defined in the outer surface 12 of the cover plate 10. The assembling region 11 is situated at a position on the inner surface 13 corresponding to the groove 121. That is, the fingerprint chip 20 is adhered to the position on the inner surface 13 corresponding to the groove 121. The groove 121 includes a bottom surface 122. Distance 1 between the bottom surface 122 and the identification surface 24 is less than or equal to 0.3 millimeters (mm). Accordingly, it is convenient for the fingerprint chip 20 to acquire the fingerprint information of the user when the user presses the bottom surface 122 of the groove 121.

Figure 13:
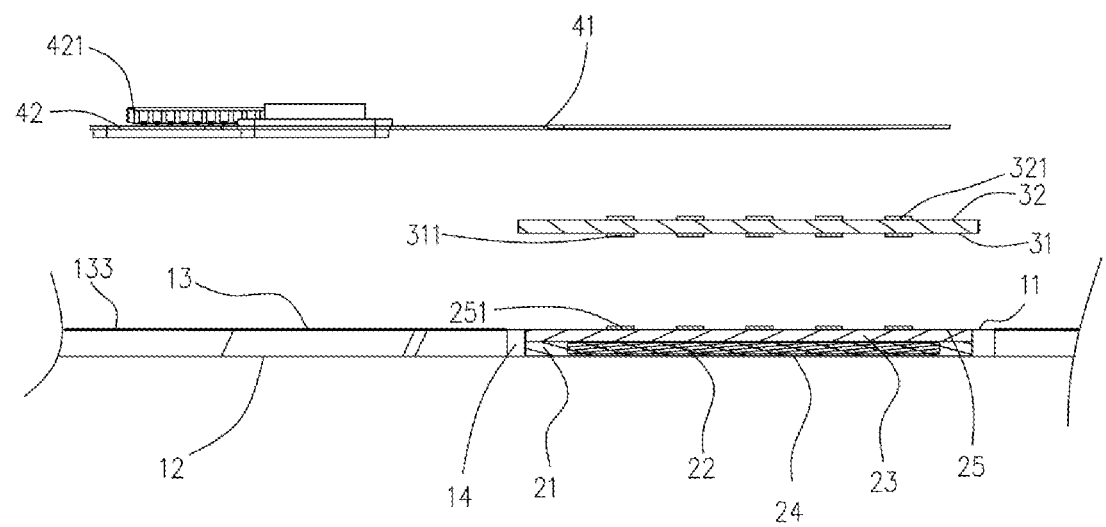
FIG. 13 illustrates a cross-sectional view of a fingerprint module in accordance with a ninth embodiment of the present disclosure.

Please refer to FIG. 13. The present disclosure further provides a ninth embodiment approximately the same as the first embodiment. A difference is that an assembling hole 14 of the cover plate 10 penetrates the outer surface 12 and the inner surface 13. The assembling region 11 is situated in the assembling hole 14. That is, the fingerprint chip 20 is situated in the assembling hole 14. By assembling the fingerprint chip 20 in the assembling hole 14, it is convenient for the user to directly touch the identification surface 24 of the fingerprint chip 20, thereby improving accuracy of fingerprint collection of the fingerprint chip 20.

Figure 15:
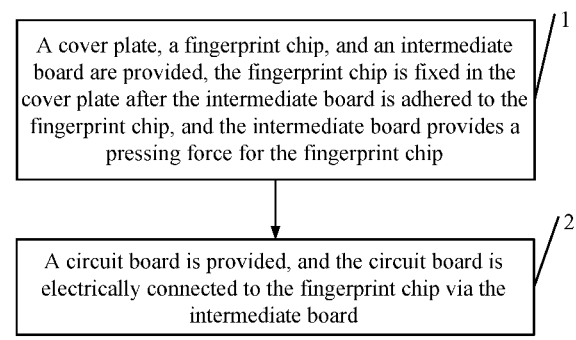
FIG. 15 illustrates a flowchart of a method for manufacturing a fingerprint module in accordance with the present disclosure.

Please refer to FIG. 15. The present disclosure further provides a method for manufacturing a fingerprint module, such as the fingerprint module 100. The method for manufacturing the fingerprint module includes the following operations of blocks 1 and 2.

At block 1, a cover plate 10, a fingerprint chip 20, and an intermediate board 30 are provided. The fingerprint chip 20 is fixed in the cover plate 10 after the intermediate board 30 is adhered to the fingerprint chip 20. The intermediate board 30 provides a pressing force for the fingerprint chip 20.

At block 2, a circuit board 40 is provided. The circuit board 40 is electrically connected to the fingerprint chip 20 via the intermediate board 30.

In a first embodiment, block 1 includes the following operations. The cover plate 10 is provided first. The cover plate 10 includes an inner surface 13. A groove 134 is defined in the inner surface 13.

Then, the intermediate board 30 is adhered to the fingerprint chip 20. The intermediate board 30 is a printed circuit board. The fingerprint chip 20 includes an identification surface 24 facing a user and a connecting surface 25 corresponding to the identification surface 24. The intermediate board 30 is adhered to the connecting surface 25 via an electrically conductive adhesive, so that entire structure of the intermediate board 30 and the fingerprint chip 20 is stable.

Finally, an adhesive is disposed on the identification surface 24. The fingerprint chip 20 is adhered to the groove 134 by the adhesive. The fingerprint chip 20 closely leans against a bottom surface 135 of the groove 134 due to gravitational force of the intermediate board 30 applied to the fingerprint chip 20, so that the fingerprint chip 20 and the cover plate 10 can be bonded firmly.

Certainly, in other embodiments, the intermediate board 30 may be adhered to the connecting surface 25 of the fingerprint chip 20 first. Then, the adhesive is coated on the identification surface 24 of the fingerprint chip 20. Finally, the cover plate 10 is provided, and the fingerprint chip 20 is adhered to the cover plate 10 via the adhesive.

In the first embodiment, the circuit board 40 is a flexible circuit board, and the circuit board 40 includes a first terminal 41 and a second terminal 42 disposed corresponding to the first terminal 41. Block 2 includes soldering the first terminal 41 to the intermediate board 30, so that the circuit board 40 is electrically connected to the fingerprint chip 20.

A second embodiment is approximately the same the first embodiment. A difference is that the intermediate board 30 is a flexible circuit board, and the intermediate board 30 includes a first connecting terminal 33 and a second connecting terminal 34 corresponding to the first connecting terminal 33.

In the second embodiment, adhering the intermediate board 30 to the fingerprint chip 20 at block 1 includes the following operations. The first connecting terminal 33 is soldered to the connecting surface 25 of the fingerprint chip 20, and a double-sided tape 39 is adhered to one surface of the first connecting terminal 33 opposite to the fingerprint chip 20.

Then, the second connecting terminal 34 is bent toward the first connecting terminal 33, so that the second connecting terminal 34 is stacked on the first connecting terminal 33. The second connecting terminal 34 is adhered to the first connecting terminal 33 via the double-sided tape 39, so that a center of gravity of the intermediate board 30 is disposed, in a direction perpendicular to the connecting surface 25, corresponding to a center of gravity of the fingerprint chip 20. As such, entire structure of the intermediate board 30 and the fingerprint chip 20 is stable.

Finally, an adhesive is disposed on the identification surface 24. The fingerprint chip 20 is adhered to the groove 134 by the adhesive. The fingerprint chip 20 closely leans against a bottom surface 135 of the groove 134 due to gravitational force of the intermediate board 30 applied to the fingerprint chip 20, so that the fingerprint chip 20 and the cover plate 10 can be bonded firmly.

A third embodiment is approximately the same as the first embodiment. A difference is that block 2 includes the following operation. The intermediate board 30 and the circuit board 40 are electrically connected via a board-to-board connector 60a.

A fourth embodiment is approximately the same as the first embodiment. A difference is that block 2 includes the following operation. The intermediate board 30 and the circuit board 40 are electrically connected via an electrically conductive adhesive 70.

In detail, the electrically conductive adhesive 70 is coated on one surface of the intermediate board 30 far away from the fingerprint chip 20. The first terminal 41 of the circuit board 40 is adhered to the second contact surface 32 via the electrically conductive adhesive 70. By heating and pressurizing the electrically conductive adhesive 70, metal particles inside the electrically conductive adhesive 70 are compressed to implement electrical conduction of the intermediate board 30 and the circuit board 40 in a direction perpendicular to the one surface of the intermediate board 30 far away from the fingerprint chip 20. As such, the circuit board 40 is electrically connected to the intermediate board 30, and the circuit board 40 and the intermediate board 30 are bonded firmly.

A fifth embodiment is approximately the same as the first embodiment. A difference is that adhering the intermediate board 30 to the fingerprint chip 20 at block 1 includes the following the operation. The fingerprint chip 20 and the intermediate board 30 are electrically connected via a board-to-board connector 60b.

Firstly, one side of the board-to-board connector 60b near the fingerprint chip 20 is soldered to a substrate 23 of the fingerprint chip 20 and electrically connected to pads 251 of the connecting surface 25.

Then, the other side of the board-to-board connector 60b is soldered to a first contact surface 31 of the intermediate board 30 and electrically connected to first pins 311 of the first contact surface 31.

Then, the two sides of the board-to-board connector 60b are assembled together, so that the intermediate board 30 and the fingerprint chip 20 are fixed together, and the structure of the fingerprint chip 20 and the intermediate board 30 is stable. The fingerprint chip 20 is pressed by weight of the board-to-board connector 60b and the intermediate board 30.

Finally, an adhesive is disposed on the identification surface 24. The fingerprint chip 20 is adhered to the groove 134 by the adhesive. The fingerprint chip 20 closely leans against a bottom surface 135 of the groove 134 due to gravitational force of the intermediate board 30 applied to the fingerprint chip 20, so that the fingerprint chip 20 and the cover plate 10 can be bonded firmly.

A sixth embodiment is approximately the same as the first embodiment. A difference is that adhering the intermediate board 30 to the fingerprint chip 20 at block 1 includes the following the operation. The fingerprint chip 20 and the intermediate board 30 are electrically connected via an electrically conductive adhesive 70a.

In detail, the electrically conductive adhesive 70a is coated on the connecting surface 25 of the fingerprint chip 20. The intermediate board 30 is adhered to the connecting surface 25 via the electrically conductive adhesive 70a. The first pins 311 on the first contact surface 31 are electrically connected to the pads 251 of the connecting surface 25 via the electrically conductive adhesive 70a.

A seventh embodiment is approximately the same as the first embodiment. A difference is that the circuit board 40 is a printed circuit board. The circuit board 40 may be a main board 202 of the mobile terminal 200 or a main board independent of the mobile terminal 200. In the seventh embodiment, block 2 includes the following operations. One side of the circuit board 40 is soldered to the main board 202 of the mobile terminal 200 (or the main board independent of the mobile terminal 200), and the other side of the circuit board 40 is soldered to the intermediate board 30.

An eighth embodiment is approximately the same as the first embodiment. A difference is that a groove 121 is defined in an outer surface 12 of the cover plate 10. The assembling region 11 is situated at a position on the inner surface 13 corresponding to the groove 121. In the eighth embodiment, fixing the fingerprint chip 20 in the cover plate 10 at block 1 includes adhering the fingerprint chip 20 to a position on the inner surface 13 corresponding to the groove 121.

A ninth embodiment is approximately the same as the first embodiment. A difference is that an assembling hole 14 penetrates the outer surface 12 and the inner surface 13 of the cover plate 10. The assembling region 11 is situated in the assembling hole 14. In the ninth embodiment, fixing the fingerprint chip 20 in the cover plate 10 at block 1 includes assembling the fingerprint chip 20 in the assembling hole 14.

It is noted that the described specific features or characteristics may be combined in a proper way in any one or more of the embodiments. For example, the intermediate board 30 which is a flexible circuit board in the second embodiment can be used in the third embodiment. That is, the operations of block 2 in the second embodiment can be used in the third embodiment. Alternatively, adhering the fingerprint chip 20 to the position on the inner surface 13 corresponding to the groove 121 at block 1 in the eighth embodiment can be used in any one of the first to seventh embodiments.

In the fingerprint module, the method for manufacturing the fingerprint module, and the mobile terminal provided by the present disclosure, the intermediate board is bonded to the fingerprint chip, so that a pressing force generated from weight of the intermediate board is applied to the fingerprint chip, and a bonding force between the fingerprint chip and the cover plate is increased. As such, the bonding between the fingerprint chip and the cover plate can be more firm. The fingerprint chip is not easily separated from the cover plate due to influence of the circuit board, thereby improving the quality of the fingerprint module.

While the embodiments of the present disclosure have been illustrated and described, it will be understood by those skilled in the art that various changes, modifications, equivalents, and variants may be made without departing from the spirit and scope of the present disclosure. Therefore, the scope of the present disclosure should be defined by the appended claims and equivalents of the appended claims.

What is claimed is:

1. A fingerprint module, comprising:
a cover plate defining an assembling region;
a fingerprint chip fixed in the assembling region;
an intermediate board bonded to a surface of the fingerprint chip opposite to the cover plate to press the fingerprint chip; and
a circuit board electrically connected to the fingerprint chip via the intermediate board;
wherein the intermediate board is a printed circuit board, the intermediate board comprises a first contact surface bonded to the fingerprint chip and a second contact surface opposite to the first contact surface, a plurality of first pins is electrically connected to the fingerprint chip and disposed on the first contact surface, a plurality of second pins is electrically connected to the first pins and disposed on the second contact surface, and the circuit board is bonded to the second contact surface and electrically connected to the second pins;
wherein the circuit board comprises a first terminal and a second terminal, the first terminal is soldered to the second pins of the intermediate board, a connector is disposed at the second terminal, and the connector is pluggable into a main board of a mobile terminal.

2. The fingerprint module of claim 1, wherein the intermediate board is a flexible circuit board.

3. The fingerprint module of claim 2, wherein the intermediate board comprises a first connecting terminal and a second connecting terminal, the first connecting terminal is electrically connected to the fingerprint chip, and the second connecting terminal is electrically connected to the circuit board.

4. The fingerprint module of claim 2, further comprising at least one strengthening plate, the at least one strengthening plate is stacked on one surface of the intermediate board opposite to the fingerprint chip, and the circuit board is electrically connected to the intermediate board via the at least one strengthening plate.

5. The fingerprint module of claim 1, wherein the intermediate board and the circuit board are electrically connected via solder, a board-to-board connector, or an electrically conductive adhesive.

6. The fingerprint module of claim 1, wherein the intermediate board and the fingerprint chip are electrically connected via solder, a board-to-board connector, or an electrically conductive adhesive.

7. The fingerprint module of claim 1, wherein the circuit board is a flexible circuit board or a printed circuit board.

8. The fingerprint module of claim 1, wherein the cover plate comprises an inner surface and an outer surface disposed opposite to the inner surface, the outer surface is configured to receive a fingerprint of a user, a groove is defined in the inner surface, and the assembling region is situated in the groove in the inner surface.

9. The fingerprint module of claim 1, wherein the cover plate comprises an inner surface and an outer surface disposed opposite to the inner surface, the outer surface is configured to receive a fingerprint of a user, a groove is defined in the outer surface, and the assembling region is situated at a position in the inner surface corresponding to the groove in the outer surface.

10. The fingerprint module of claim 1, wherein the cover plate comprises an inner surface and an outer surface disposed opposite to the inner surface, an assembling hole penetrates the outer surface and the inner surface of the cover plate, and the assembling region is situated in the assembling hole.

11. A method for manufacturing a fingerprint module, comprising:
providing a cover plate, a fingerprint chip, and an intermediate board;
fixing the fingerprint chip in the cover plate after the intermediate board is adhered to the fingerprint chip, wherein the intermediate board is configured to provide a pressing force for the fingerprint chip;
providing a circuit board, wherein the circuit board comprises a first terminal, a second terminal, and a connector disposed at the second terminal, the first terminal is configured to be electrically connected to the intermediate board, the connector is configured to be pluggable into a main board of a mobile terminal; and
electrically connecting the circuit board to the fingerprint chip via the intermediate board.

12. The method for manufacturing the fingerprint module of claim 11, wherein the intermediate board is a printed circuit board, and the intermediate board and the fingerprint chip are electrically connected via an electrically conductive adhesive.

13. The method for manufacturing the fingerprint module of claim 12, wherein the circuit board is a flexible circuit board, and the intermediate board and the circuit board are electrically connected via solder, a board-to-board connector, or an electrically conductive adhesive.

14. The method for manufacturing the fingerprint module of claim 11, wherein the fingerprint chip is adhered to an inner surface of the cover plate via an adhesive.

15. The method for manufacturing the fingerprint module of claim 11, wherein the intermediate board comprises a first connecting terminal and a second connecting terminal, the method further comprises:
soldering the first connecting terminal to the fingerprint chip; and bending the second connecting terminal toward the first connecting terminal, so that the second connecting terminal is stacked on the first connecting terminal.

16. The method for manufacturing the fingerprint module of claim 11, wherein the intermediate board is a flexible circuit board, the method further comprises:
   stacking at least one strengthening plate on one surface of the intermediate board opposite to the fingerprint chip; and
   electrically connecting the circuit board to the intermediate board via the at least one strengthening plate.

17. A mobile terminal, comprising a fingerprint module, wherein the fingerprint module, comprises:
   a cover plate defining an assembling region;
   a fingerprint chip fixed in the assembling region;
   an intermediate board bonded to a surface of the fingerprint chip opposite to the cover plate to press the fingerprint chip; and
   a circuit board electrically connected to the fingerprint chip via the intermediate board;
   wherein the intermediate board is a printed circuit board, the intermediate board comprises a first contact surface bonded to the fingerprint chip and a second contact surface opposite to the first contact surface, a plurality of first pins is electrically connected to the fingerprint chip and disposed on the first contact surface, a plurality of second pins is electrically connected to the first pins and disposed on the second contact surface, and the circuit board is bonded to the second contact surface and electrically connected to the second pins;
   wherein the circuit board comprises a first terminal and a second terminal, the first terminal is soldered to the second pins of the intermediate board, a connector is disposed at the second terminal, and the connector is pluggable into a main board of a mobile terminal.

* * * * *